United States Patent
Holleck et al.

[11] Patent Number: 6,110,329
[45] Date of Patent: Aug. 29, 2000

[54] METHOD OF MANUFACTURING A COMPOSITE MATERIAL

[75] Inventors: Helmut Holleck; Michael Stüber, both of Karlsruhe, Germany

[73] Assignee: Forschungszentrum Karlsruhe GmbH, Karlsruhe, Germany

[21] Appl. No.: 09/215,392

[22] Filed: Dec. 18, 1998

Related U.S. Application Data

[63] Continuation-in-part of application No. PCT/EP97/03292, Jun. 24, 1997.

[30] Foreign Application Priority Data

Jun. 25, 1996 [DE] Germany ............ 196 25 329

[51] Int. Cl.[7] .................................. C23C 14/35
[52] U.S. Cl. .................. 204/192.15; 204/192.16
[58] Field of Search ............ 204/192.15, 192.16

[56] References Cited

U.S. PATENT DOCUMENTS

| 4,822,466 | 4/1989 | Rabalais et al. ............ 204/192.15 |
| 5,178,739 | 1/1993 | Barnes et al. ............ 204/192.12 |

FOREIGN PATENT DOCUMENTS

| 0 267 679 | 5/1988 | European Pat. Off. ........ C23C 16/02 |
| 0 294 572 | 12/1988 | European Pat. Off. ........ C23C 16/52 |
| 195 02 568 | 7/1996 | Germany ................ C23C 14/06 |
| 04 064 920 | 2/1992 | Japan ..................... G11B 5/72 |

OTHER PUBLICATIONS

Holmberg et al., "Tribological Characteristics of Hydrogenated and Hydrogen–free Diamond–like Carbon Coatings", Diamond Films and Technology, vol. 4, No. 2.

*Primary Examiner*—Nam Nguyen
*Assistant Examiner*—Steven H. VerSteeg
*Attorney, Agent, or Firm*—Klaus J. Bach

[57] ABSTRACT

In a method of manufacturing a composite material structure consisting of a substrate with a layer of essentially pure $sp^2$- and $sp^3$-hybridized carbon with a $sp^3$-hybridized carbon proportion which increases toward the surface of the carbon layer, the carbon layer is deposited on the substrate by a PVD process using a magnetron sputtering apparatus in a process chamber in which an argon partial pressure of 0.6 to 1.0 pa is maintained and, during the carbon deposition, a bias voltage is maintained which is increased with increasing thickness of the layer from 0 to 300 volts.

4 Claims, 7 Drawing Sheets

A: a-C Type I of Hard Metal without Bias
B: Type A with 200 μm TiC-Interface
C: a-C Type II on Hard Metal 300valve Bias
D: a-C Type II (DLC) on Hard Metal, with TIC-Interface and Bias Gradient

METHOD OF MANUFACTURING A COMPOSITE MATERIAL

This is a Continuation-in-Part application of pending international application PCT/EP97/03292 filed Jun. 24, 1997 and claiming the priority of German application 196 25 329.2 filed Jun. 25, 1996.

BACKGROUND OF THE INVENTION

The invention relates to a method of manufacturing a composite material comprising a substrate and, disposed thereon, a layer consisting essentially of pure $sp^2$ and $sp^3$ hybridized carbon wherein the $sp^3$ hybridized carbon content increases with increasing distance from the substrate.

Such composite material structures and methods of making them are disclosed in a publication by S. J. Bull: "Tribology of carbon coatings: DLC, Diamond and Beyond", Diamond and Related Materials 4 (1995), pages 827–836. The publication is concerned with amorphous carbon layers deposited on substrates which carbon layers include $sp^2$ as well as $sp^3$ bonds: Such carbon (DLC) layers are called "diamond-like carbon" (DLC) layers. The hardness of such layers depends on various parameters, particularly on the proportion of the $sp^3$ hybridized bonds or respectively, the bias voltage applied during the manufacture of the layers in a sputtering procedure. However, adhesion of the layer to the substrate is considered by the author of the publication to be problematic. Since diamond-like layers are chemically inert, they do not form bonds with the substrate. For this reason, frequently a carbide forming element is deposited on the substrate as an intermediate layer which provides for the best adherence to diamond-like layers. Silicon or silicon carbide is suitable for such an intermediate layer. Reference is made in the publication to intermediate layers of complicated composition. Another problem resides in the fact that the greatest hardness is obtained with those diamond-like layers which have the highest internal tensions.

In the Proceedings of the $2^{nd}$ International Conference on the Applications of Diamond Fibers and Related Materials, Editors M. Yoshikawa et al., pages 221 to 228 (Richard L. C. Wu and Kazuhisa Miyoshi: "Application of Diamond and Diamond-like Carbon Films as Lubricating Coatings") MYU, Tokyo 1993, diamond-like layers are also disclosed which were applied to a substrate ([100] Si) by direct ion beam deposition from a Kaufman ion source. The authors state that the proportion of the $sp^3$-hybridized carbon was about 50 times as large as the $sp^2$ hybridized carbon proportion. The layers were found to be very hard and amorphous.

In the same Proceedings, there is furthermore a publication by Erich Bergmann: "Industrial Applications of Metal Containing Diamond Like Carbon Fibers" (pages 833–844). The author compares pure diamond-like carbon layers with metal containing diamond-like carbon layers and arrives at the conclusion that, with the metal-containing layers, among others, the problem of adherence of the layers on the substrate can be avoided.

It is the object of the present invention to provide a method of manufacturing a composite material structure including a surface with a relatively high $sp^3$ hybridized carbon content which is therefore very hard, but which adheres well to the substrate and, inspite of the high hardness, has relatively low internal stresses.

SUMMARY OF THE INVENTION

In a method of manufacturing a composite material structure consisting of a substrate with a layer of essentially pure $sp^2$ and $sp^3$ hybridized carbon with an $sp^3$ hybridized carbon proportion which increases toward the surface of the layer, the carbon layer is deposited on the substrate by a PVD process using a magnetron sputtering apparatus in a process chamber in which an argon partial pressure of 0.6 to 1.0 pa is maintained and, during the carbon deposition, a bias voltage is maintained which is increased with increasing thickness of the layer from 0 volts to 300 volts.

The substrate on which the gradient layer is deposited may consist of any material; it may comprise metal, ceramics or a thermally sufficiently resistant plastic material.

Generally, the gradient layer adheres well to the substrate if the layer is thin. If, with thicker layers (over about 1 μm), the adherence is insufficient an intermediate layer preferably of the carbide, nitride or boride of a transition metal may be provided. TiC has been found to form a suitable intermediate layer. The thickness of the intermediate layer should be about 5 to 300 nm, preferably 5 to 50 nm. It can be applied by known methods for example by magnetron sputtering.

The gradient layer which is disposed on the substrate or, respectively, on the intermediate layer consists of pure carbon—disregarding unavoidable impurities. Preferably, it has a thickness of 0.5 μm to 5 μm, and preferably, a thickness of 1 to 3 μm. The interface area with the substrate or the intermediate layer should comprise mainly $sp^2$ hybridized bonds. The interface area is amorphous, has low internal tensions and is relatively soft at 1600 to 2000 HV. This part of the layer provides for the adhesion to the substrate or the intermediate layer. In the direction toward the free surface of the layer the proportion of $sp^3$ hybridized bonds increases so that finally the $sp^2$ hybridized bond proportion becomes small and there are mainly $sp^3$ hybridized bonds. The free surface of the layer therefore comprises essentially diamond-like that is very hard carbon.

Such layers can be generated utilizing PVD-processes. In order to provide the desired gradient layer, the impulse or input (bias voltage) into the layer must be increased during the layer deposition. If the impulse input is continuously increasing toward the surface. The impulse application, however, can also be discontinuously increased.

In that case, a gradient layer is generated with properties which change between the interface area and the surface in a stepwise fashion.

Below, the invention will be described in greater detail on the basis of an embodiment with reference to the accompanying drawings.

DESCRIPTION OF PARTICULAR EMBODIMENTS

EXAMPLE

Manufacture of an embodiment of a composite material structure by the method according to the invention.

By magnetron sputtering from a graphite target at an energy of 150 W and an argon partial pressure of 0.6 to 10 Pa (alternately: 90 Vol % Ar, 10 Vol % $H_2$) carbon layers of a total layer thickness of 1 to 5 μm were deposited on various substrates at a deposition temperature of 100 to 200° C. The substrates consisted of silicon, hard metal, aluminum, aluminum oxide, and silicon carbide. They were etched by 500 W HF for 10 minutes before the carbon deposition. The intermediate layer was prepared by sputtering in the process chamber of a magnetron sputtering apparatus from a TiC-target onto the substrate a 5 to 100 nm thick TiC layer. The subsequent carbon deposition was performed in the same process chamber by sputtering using a graphite target. During the carbon deposition, the bias voltage was continuously increased from 0 V to 300 V. With several substrates, the carbon layer was built up in three stages; 30 minutes at 0 V bias voltage, 30 to 40 minutes at 150 V bias voltage and 30 min. at 300V bias voltage.

Figure 1:
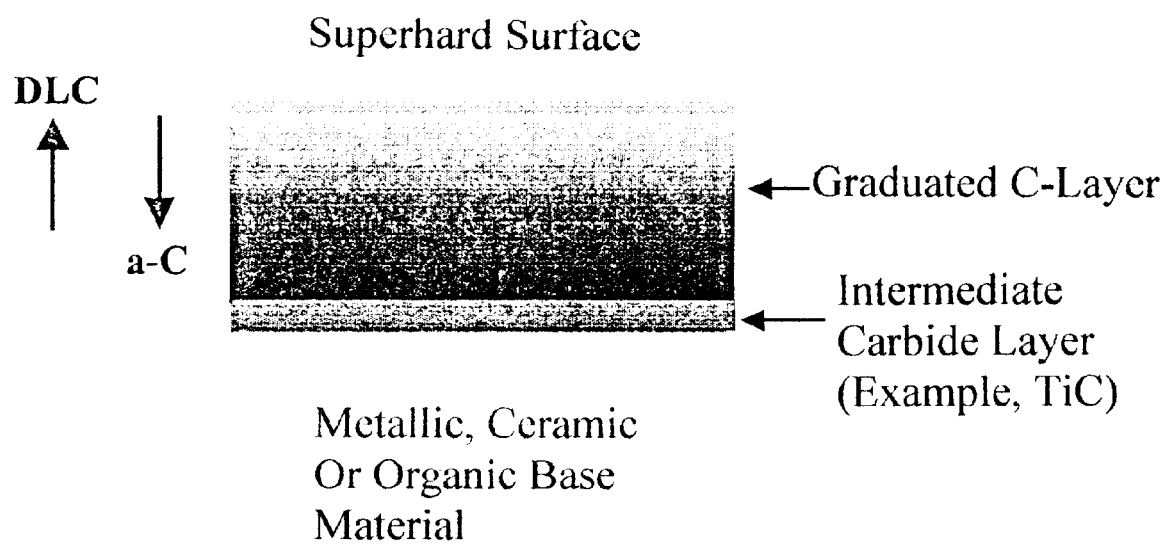
FIG. 1 as a schematic representation of a composite material structure as produced by the method according to the invention.

FIG. 1 shows an example of a composite material structure according to the invention. On a hard metal substrate an about 200 nm thick layer of titanium-carbide is deposited. On the titanium carbide layer, a graduated carbon layer is disposited which was produced by sputtering with a continuously increasing bias voltage as described in the example above. The layer thickness is 2 μm. The test results presented in the following figures were obtained with this composite material structures if not otherwise stated.

Figure 2:
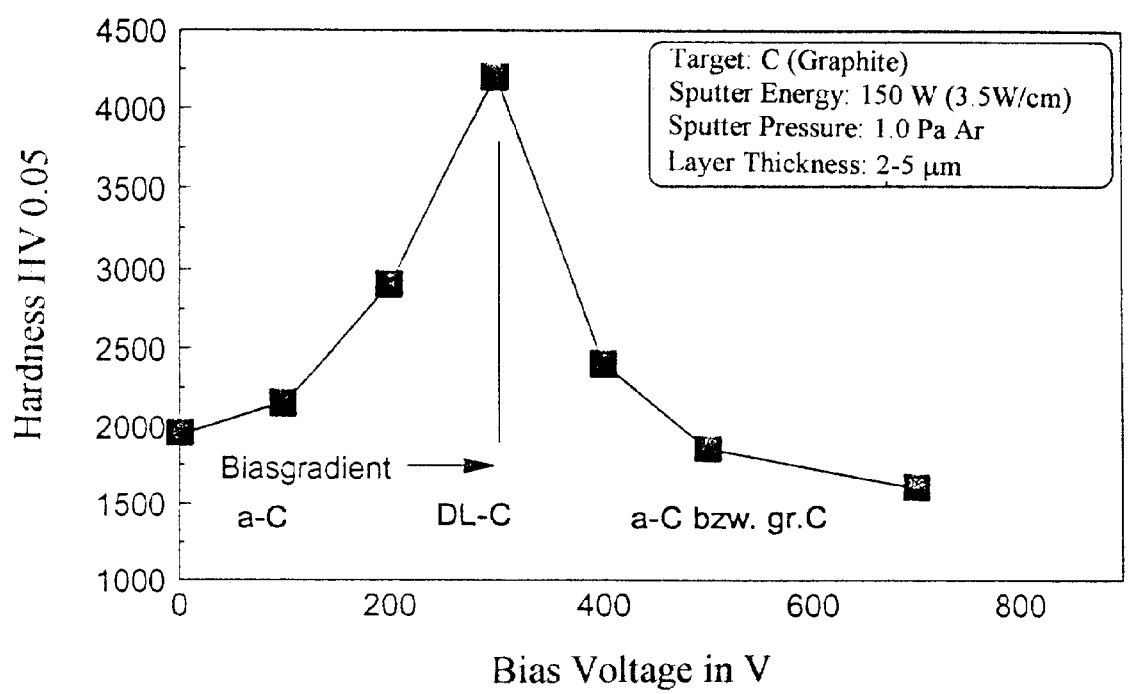
FIG. 2 shows the influence of the gradient of the bias voltage on the hardness of the carbon layer of the composite material structure.

FIG. 2 shows the dependence of the hardness $HV_{0.05}$ on the gradient of the bias voltage. The bias voltage gradient indicates up to which level the bias voltage was increased during the layer deposition starting from zero voltage. The examined homogeneous graduated carbon layers were each 2 to 5 μm thick. The target consisted of graphite; the sputtering energy was 150 W (3.5 W/cm) and the sputtering pressure was 1.0 Pa Ar. At bias voltages below 200V amorphous carbon layers are formed whose $sp^3$ proportion increases with the bias voltage. The highest hardness is obtained with a bias voltage of about 300 V. At higher bias voltages, the hardness drops and amorphous graphite-like layers are again formed.

Figure 3:
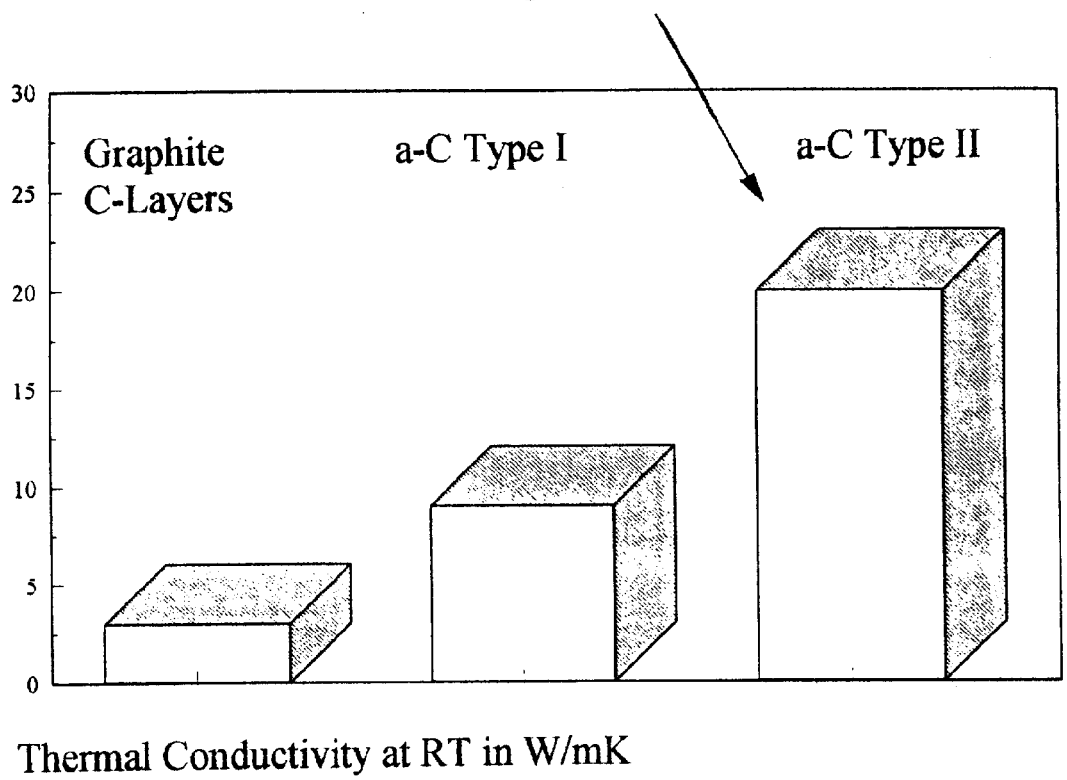
FIG. 3 shows a comparison between the thermal conductivities of various carbon layers.

FIG. 3 shows the thermal conductivities of various carbon layers at room temperature in [W/mk]. The left column shows, for comparison, the heat conductivity of homogeneous graphite carbon layers. The center column indicates the heat conductivity of amorphous layers which correspond to the interface areas of the composite material structure according to the invention. The right column represents the gradient layer of the composite material structure according to the invention. The heat conductivity of the gradient layer is greater than that of graphite carbon layers by more than a factor of 4.

Figure 4:
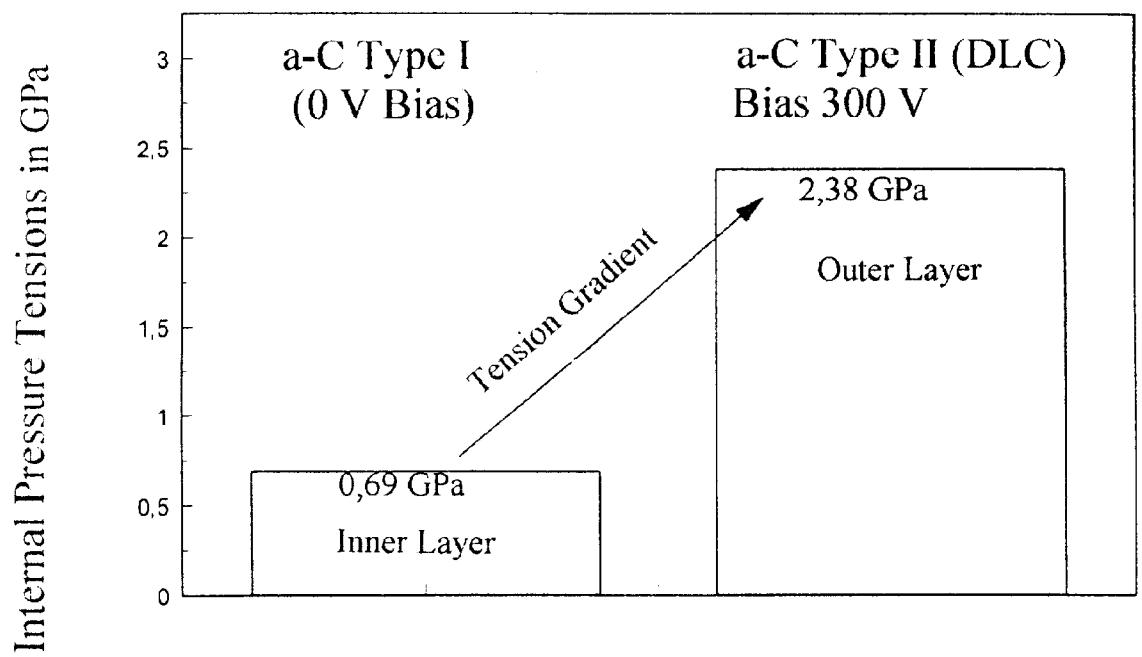
FIG. 4 shows the internal pressure tensions of an amorphous carbon layer and the carbon layer formed by the method according to the invention.

FIG. 4 shows the internal pressure tensions in [Gpa] in amorphous carbon layers. The left column indicates the internal pressure tensions of the amorphous carbon with high proportions of $sp^2$-hybridization bonds as it is generated in accordance with the method of the invention in the carbon layer of the composite material structure in the interface area with the substrate or the intermediate layer at a voltage of 0 V. The internal pressure tension is 0.69 Gpa. The right column indicates the internal pressure tension (238 Gpa) of a complete carbon gradient layer, wherein the bias voltage was increased to 300 V. The internal pressure tension at the surface of the gradient layers would be even higher: however, the high internal pressure tension at the surface is partially compensated for by the greater softness of the interface area.

Figure 5:
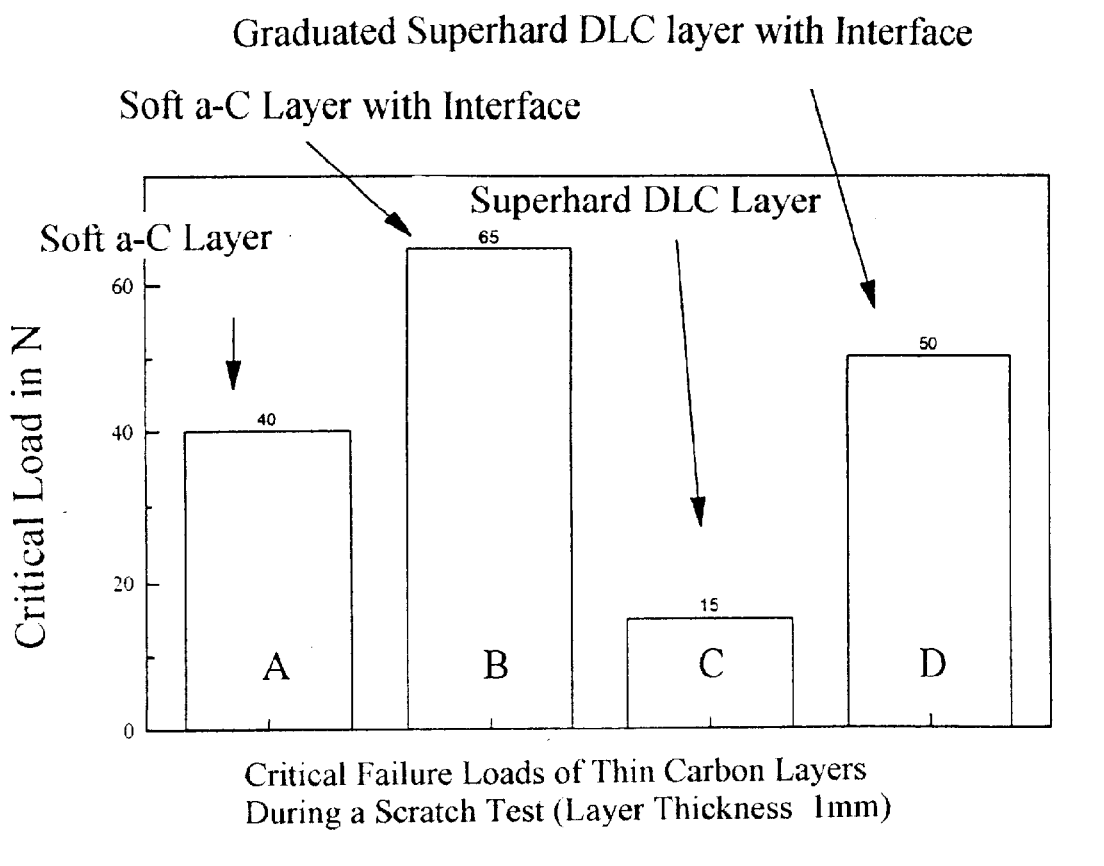
FIG. 5 shows the critical loads for failure of various carbon layers.

FIG. 5 shows the critical loads in [N] at which thin carbon layers fail the scratch test. The layer thickness was 1 μm. The column A represents a carbon layer deposited directly, that is without intermediate layer, onto a hard metal substrate. With a bias voltage of 0 V, it corresponds to the amorphous carbon layer in the interface area of the composite material structure made according to the method of the invention. The critical load is 40 N. The column B represents a composite material structure corresponding to that of column A, wherein, however, a 200 nm thick intermediate layer of TiC is present. The critical load is 65 N. The column C represents the critical load of a composite material structure of hard metal and a diamond-like layer with high $sp^3$ hybridization proportion (15 N) which was generated with a bias voltage gradient of 300 V, without intermediate layer. In the morphology, it corresponds to the surface area of the gradient layer provided in accordance with the method of the invention. Finally, the column D shows the critical load (50 N) of an embodiment of the composite material structure made in accordance with the method of the invention with a hard metal substrate, a 200 nm thick TiC intermediate layer and a bias gradient changing continuously from 0 to 300 V. It is apparent that the critical load for the composite material structure is high although the super hard surface of the carbon gradient layer has high pressure tensions.

Figure 6:
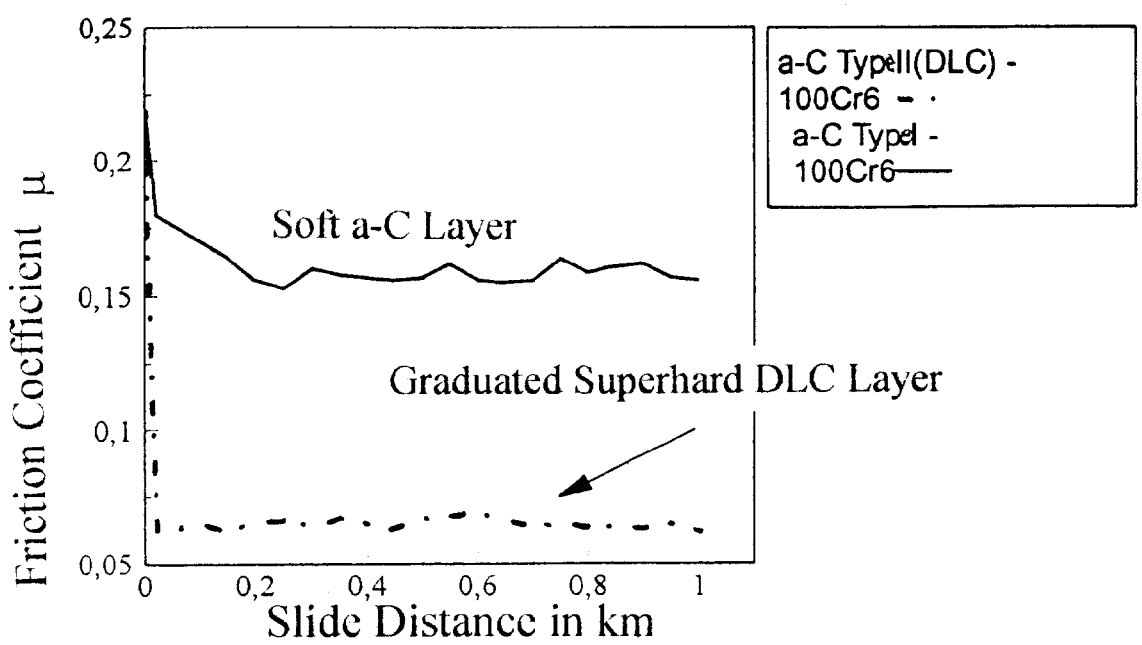
FIG. 6 shows the friction coefficients as measured on an amorphous carbon layer and on the carbon layer of the composite material structure made by the method according to the invention.

FIG. 6 shows the friction coefficient μ over the slide distance in [km]. The solid line corresponds to a layer as represented by the column A in FIG. 5. The dash-dotted line represents the friction for a composite material structure as made by the method according to the invention. The friction of the composite material structure is substantially lower. The measurements were taken with a slide wear (10 N, relative air humidity 35 %, V=0.03 m/s) on the basis of 100 Cr6.

Figure 7:
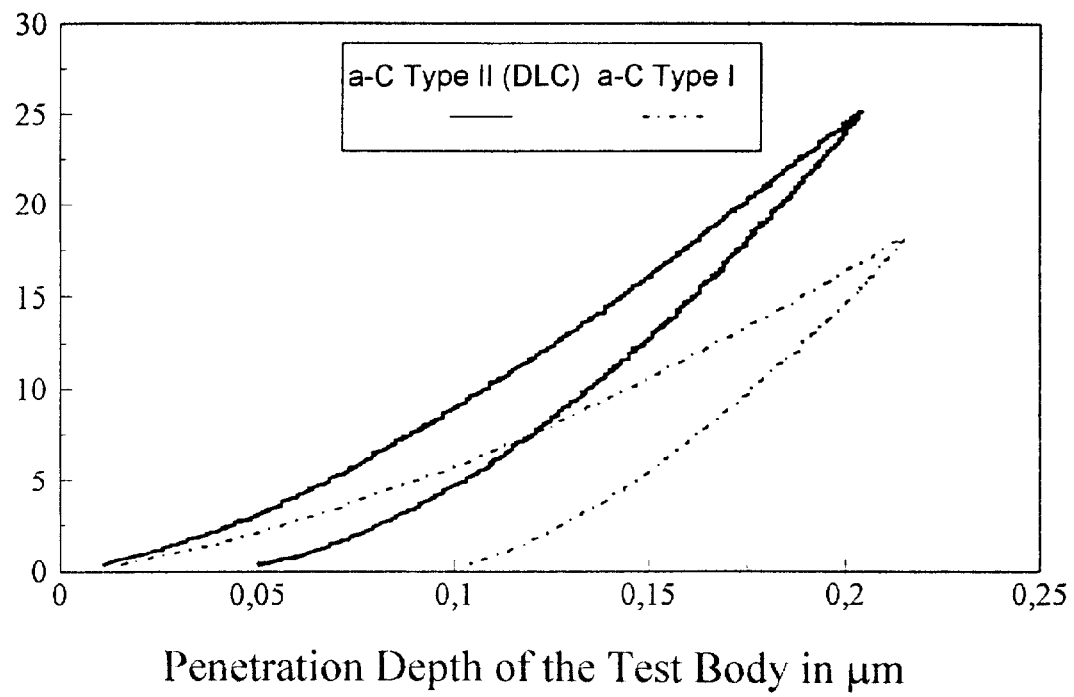
FIG. 7 shows the penetration depth of a test member (nanoindenter) into an amorphous carbon layer and into the composite material structure made by the method according to the invention.

FIG. 7 shows the test force in mN over the penetration depth of the test body in μm. The solid curve shows the results for the composite material structure made in accordance with the method of the invention whereas the dash-dotted curve represents a carbon layer as described with regard to column A of FIG. 5. The penetration depth in the composite material structure made in accordance with the method of the invention are noticeably smaller and indicate a relatively high elastic proportion.

What is claimed is:

1. A method of manufacturing a composite material structure consisting of a substrate and a layer including $sp^2$- and $sp^3$-hybridized carbon having an interface area with the substrate and an exposed surface, said layer having a $sp^3$-hybridized carbon proportion which increases from said interface area toward said exposed surface, said method comprising the steps of:

a) depositing by physical vapor deposition (PVD) on said substrate carbon to form said carbon layer from a graphite target using a magnetron sputtering apparatus in a process chamber in which an argon partial pressure of 0.6 to 1.0 Pa is maintained, and b) maintaining, during the deposition of said carbon layer, between said target and said substrate a bias voltage for applying an impulse to the carbon layer being formed on said substrate, and increasing the bias voltage with increasing layer thickness from 0 Volts to 300 Volts in such a way that the impulse application to said layer is continuously or discontinuously increased.

2. A method according to claim 1, wherein, an intermediate layer is sputtered onto said substrate from a target consisting of one of a carbide, a nitride and a boride of a transition metal before said carbon layer is deposited.

3. A method according to claim 2, wherein said intermediate layer has a thickness of 5 to 300 nm.

4. A method according to claim 1, wherein said layer of carbon has a thickness of 0.5 to 5 $\mu$m.

* * * * *